(12) United States Patent
Harita

(10) Patent No.: US 9,967,989 B2
(45) Date of Patent: May 8, 2018

(54) DISPLAY DEVICE

(71) Applicants: KABUSHIKI KAISHA TOSHIBA, Tokyo (JP); TOSHIBA VISUAL SOLUTIONS CORPORATION, Misawa-shi, Aomori (JP)

(72) Inventor: Keisuke Harita, Fukaya Saitama (JP)

(73) Assignees: KABUSHIKI KAISHA TOSHIBA, Tokyo (JP); TOSHIBA VISUAL SOLUTIONS CORPORATION, Aomori (JP)

( * ) Notice: Subject to any disclaimer, the term of this patent is extended or adjusted under 35 U.S.C. 154(b) by 15 days.

(21) Appl. No.: 15/181,036

(22) Filed: Jun. 13, 2016

(65) Prior Publication Data

US 2016/0295727 A1 Oct. 6, 2016

Related U.S. Application Data

(63) Continuation of application No. 14/816,443, filed on Aug. 3, 2015, now Pat. No. 9,392,717, which is a
(Continued)

(30) Foreign Application Priority Data

Aug. 11, 2010 (JP) ................................. 2010-180375

(51) Int. Cl.
*H05K 5/02* (2006.01)
*H05K 5/00* (2006.01)
(Continued)

(52) U.S. Cl.
CPC ......... *H05K 5/0247* (2013.01); *H05K 5/0017* (2013.01); *H05K 5/02* (2013.01);
(Continued)

(58) Field of Classification Search
CPC ... H05K 7/02; H05K 5/0017; Y10T 29/49002
See application file for complete search history.

(56) References Cited

U.S. PATENT DOCUMENTS

| 5,347,430 A | 9/1994 | Curlee et al. |
| 5,742,003 A * | 4/1998 | Ho .......................... G06F 1/182 174/372 |

(Continued)

FOREIGN PATENT DOCUMENTS

| JP | 05-095196 A | 4/1993 |
| JP | 10-161555 A | 6/1998 |

(Continued)

OTHER PUBLICATIONS

Decision of a Patent Grant mailed by JPO dated Feb. 7, 2012 in the corresponding Japanese Application 2010-180375, 3 pages.
(Continued)

*Primary Examiner* — David M Sinclair
*Assistant Examiner* — Robert Brown
(74) *Attorney, Agent, or Firm* — Knobbe, Martens, Olson & Bear, LLP

(57) ABSTRACT

According to one embodiment, a display device includes a display, a circuit substrate, connector terminals, a first cover, a second cover, and a fastening member. The circuit substrate includes a first side and a second side adjacent to the first side, and overlaps a second face of the display. The connector terminals are disposed at a vicinity of each of the first side and the second side. The first cover includes a first opening exposing the connector terminals therethrough, and covers the second face. The second cover includes a linking portion and a noncircular through hole, and covers the first opening across the first side and the second side. The linking portion is positioned in between the first side and the second side. The fastening member is inserted through the through
(Continued)

hole so as to fix the second cover, the circuit substrate, and the display.

7 Claims, 15 Drawing Sheets

Related U.S. Application Data continuation of application No. 14/627,325, filed on Feb. 20, 2015, now Pat. No. 9,277,666, which is a continuation of application No. 13/670,404, filed on Nov. 6, 2012, now Pat. No. 8,988,868, which is a continuation of application No. 13/116,972, filed on May 26, 2011, now abandoned.

(51) Int. Cl.
  *H05K 7/14* (2006.01)
  *H05K 7/02* (2006.01)
  *H05K 5/03* (2006.01)

(52) U.S. Cl.
  CPC ............ *H05K 5/03* (2013.01); *H05K 7/02* (2013.01); *H05K 7/1427* (2013.01); *Y10T 29/49002* (2015.01)

(56) References Cited

U.S. PATENT DOCUMENTS

| | | | |
|---|---|---|---|
| 5,822,182 A | 10/1998 | Scholder et al. | |
| 6,066,001 A | 5/2000 | Liptak et al. | |
| 6,166,325 A * | 12/2000 | Wu | H05K 9/0039 174/377 |
| 6,239,358 B1 * | 5/2001 | Chang | H05K 9/0016 174/354 |
| 6,252,160 B1 * | 6/2001 | Chang | H05K 9/0016 174/377 |
| 6,362,860 B1 * | 3/2002 | Sagawa | G02F 1/133308 349/59 |
| 6,560,124 B1 * | 5/2003 | Irie | H05K 5/02 174/377 |
| 7,250,725 B2 * | 7/2007 | Nomoto | H05K 5/02 313/582 |
| 7,259,964 B2 * | 8/2007 | Yamamura | H04N 5/64 313/11 |
| 7,357,675 B2 | 4/2008 | Barringer et al. | |
| 7,379,302 B2 | 5/2008 | Cai et al. | |
| 7,492,609 B2 * | 2/2009 | Wang | G02F 1/133308 361/816 |
| 7,570,318 B2 * | 8/2009 | Li | G02F 1/133308 349/58 |
| 7,606,044 B2 | 10/2009 | Bailey et al. | |
| 7,611,371 B2 | 11/2009 | Guo | |
| 7,751,200 B2 | 7/2010 | Harita | |
| 7,796,378 B2 | 9/2010 | Jang et al. | |
| 7,824,194 B2 | 11/2010 | Suzuki et al. | |
| 7,909,643 B2 * | 3/2011 | Pepe | H01R 13/6658 439/540.1 |
| 7,929,318 B2 | 4/2011 | Matsutani | |
| 7,944,523 B2 * | 5/2011 | Kwak | G02F 1/133308 349/149 |
| 8,988,868 B2 | 3/2015 | Harita | |
| 9,277,666 B2 * | 3/2016 | Harita | H05K 5/02 |
| 9,392,717 B2 * | 7/2016 | Harita | H05K 5/02 |
| 2005/0185365 A1 * | 8/2005 | Yamaguchi | G06F 1/1601 361/679.21 |
| 2006/0181841 A1 * | 8/2006 | Chen | H04M 1/0266 361/679.3 |
| 2007/0103617 A1 * | 5/2007 | Kitajima | G02B 6/0028 349/58 |
| 2007/0139579 A1 * | 6/2007 | Zhang | G02F 1/133308 349/58 |
| 2008/0116045 A1 | 5/2008 | Matsutani | |
| 2008/0253076 A1 * | 10/2008 | Chen | G06F 1/186 361/679.31 |
| 2009/0046438 A1 * | 2/2009 | Maeda | H05K 7/20509 361/756 |
| 2009/0185341 A1 * | 7/2009 | Jang | F16M 11/041 361/679.22 |
| 2010/0259881 A1 * | 10/2010 | Choi | G06F 1/1601 361/679.21 |
| 2010/0271762 A1 * | 10/2010 | Chiang | H05K 9/0022 361/679.01 |
| 2011/0063780 A1 * | 3/2011 | Yang | H05K 5/0239 361/679.01 |
| 2011/0122557 A1 * | 5/2011 | Takeguchi | G06F 1/1615 361/679.01 |
| 2012/0039030 A1 * | 2/2012 | Harita | H05K 5/02 361/679.01 |
| 2013/0003268 A1 * | 1/2013 | Cheon | H05K 5/02 361/679.01 |
| 2013/0058025 A1 * | 3/2013 | Harita | H05K 5/02 361/679.01 |
| 2013/0094151 A1 * | 4/2013 | Escamilla | H05K 5/065 361/714 |
| 2013/0250524 A1 * | 9/2013 | Augsburger | H05K 7/1427 361/728 |

FOREIGN PATENT DOCUMENTS

| | | |
|---|---|---|
| JP | 2003-345265 A | 12/2003 |
| JP | 2005-221886 | 8/2005 |
| JP | 2005-223748 | 8/2005 |
| JP | 2007-212955 A | 8/2007 |
| JP | 2008-129369 | 6/2008 |
| JP | 2009-069481 | 4/2009 |
| JP | 2010-057030 A | 3/2010 |

OTHER PUBLICATIONS

Notice of Allowance for U.S. Appl. No. 14/627,325, dated Oct. 27, 2015.

* cited by examiner

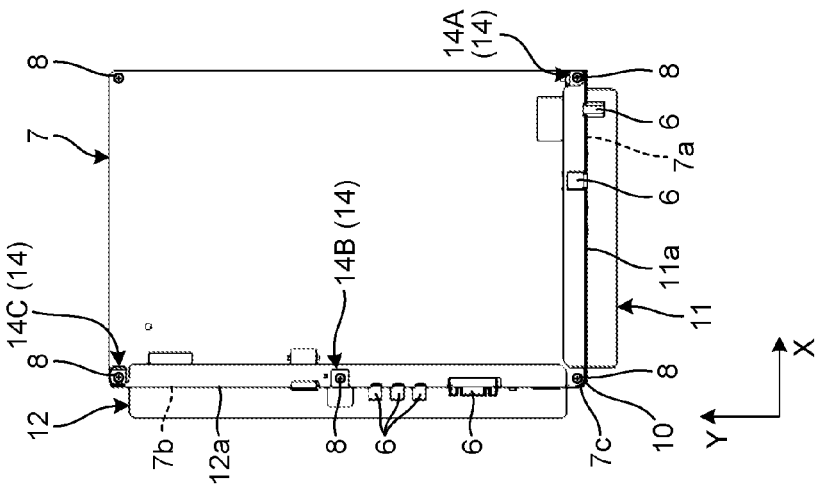
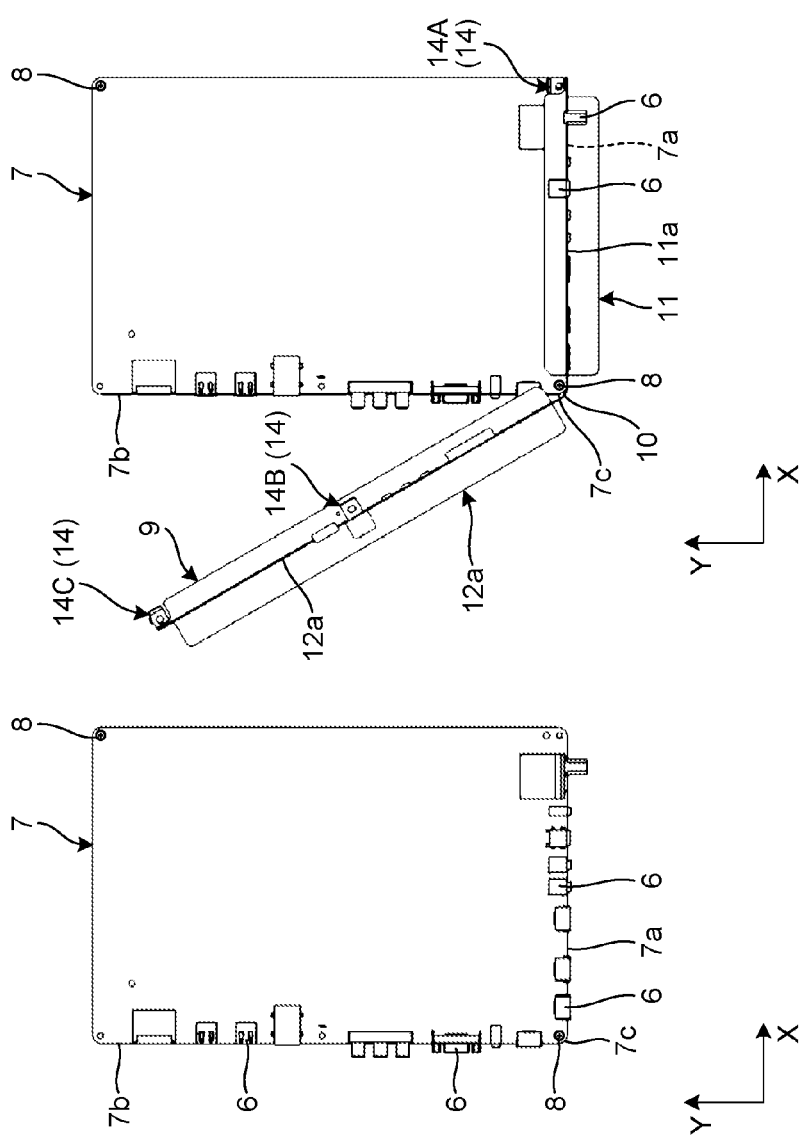

DISPLAY DEVICE

CROSS-REFERENCE TO RELATED APPLICATIONS

This application is a continuation of U.S. patent application Ser. No. 14/816,443, filed on Aug. 3, 2015, which is a continuation of U.S. patent application Ser. No. 14/627,325, filed on Feb. 20, 2015, which is a continuation of U.S. patent application Ser. No. 13/670,404, filed on Nov. 6, 2012, which is a continuation of U.S. patent application Ser. No. 13/116,972, filed on May 26, 2011, which is based upon and claims the benefit of priority from Japanese Patent Application No. 2010-180375, filed Aug. 11, 2010; the entire contents of these applications are incorporated herein by reference.

FIELD

Embodiments described herein relate generally to a display device and a manufacturing method thereof.

BACKGROUND

Typically, display devices are known in which a connector is exposed through an opening formed on a rear face of a housing.

With regard to such display devices, there is a demand for reducing the time and efforts required during manufacturing even in the case when more than one connector is disposed.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIGS. 20A to 20C are exemplary plan views illustrating a sequence of fixing the side cover to the substrate of the display device, and FIG. 20A is an exemplary plan view of only the substrate, FIG. 20B is an exemplary plan view of the substrate close to which a first facing portion of the side cover is disposed, and FIG. 20C is an exemplary plan vie of the substrate close to which the first facing portion and a second facing portion of the side cover is arranged.

DETAILED DESCRIPTION

In general, according to one embodiment, a display device comprises a display, a circuit substrate, a plurality of connector terminals, a first cover, a second cover, and a fastening member. The display comprises a first face and a second face. The first face comprises a display screen. The second face is on an opposite side of the first face. The circuit substrate comprises a first side and a second side adjacent to the first side, and overlaps the second face of the display. The plurality of connector terminals are disposed at a vicinity of each of the first side and the second side of the circuit substrate. The first cover comprises a first opening exposing the connector terminals therethrough, and covers the second face. The second cover comprises a linking portion and a noncircular through hole, and covers the first opening across the first side and the second side of the circuit substrate. The linking portion is positioned in between the first side and the second side. The fastening member is inserted through the through hole of the second cover so as to fix the second cover, the circuit substrate, and the display.

An embodiment is described in detail below with reference to the accompanying drawings. For the sake of convenience in the following explanation, the directions are defined in the following manner. When viewed from the front of a display device 1, the leftward direction (or when viewed from behind, the rightward direction) is defined as the X direction, the upward direction is defined as the Y direction, and the depth direction (backward direction) is defined as the Z direction. In the accompanying drawings, arrows are illustrated to represent the abovementioned directions in the assembled state of the display device 1.

Figure 1:
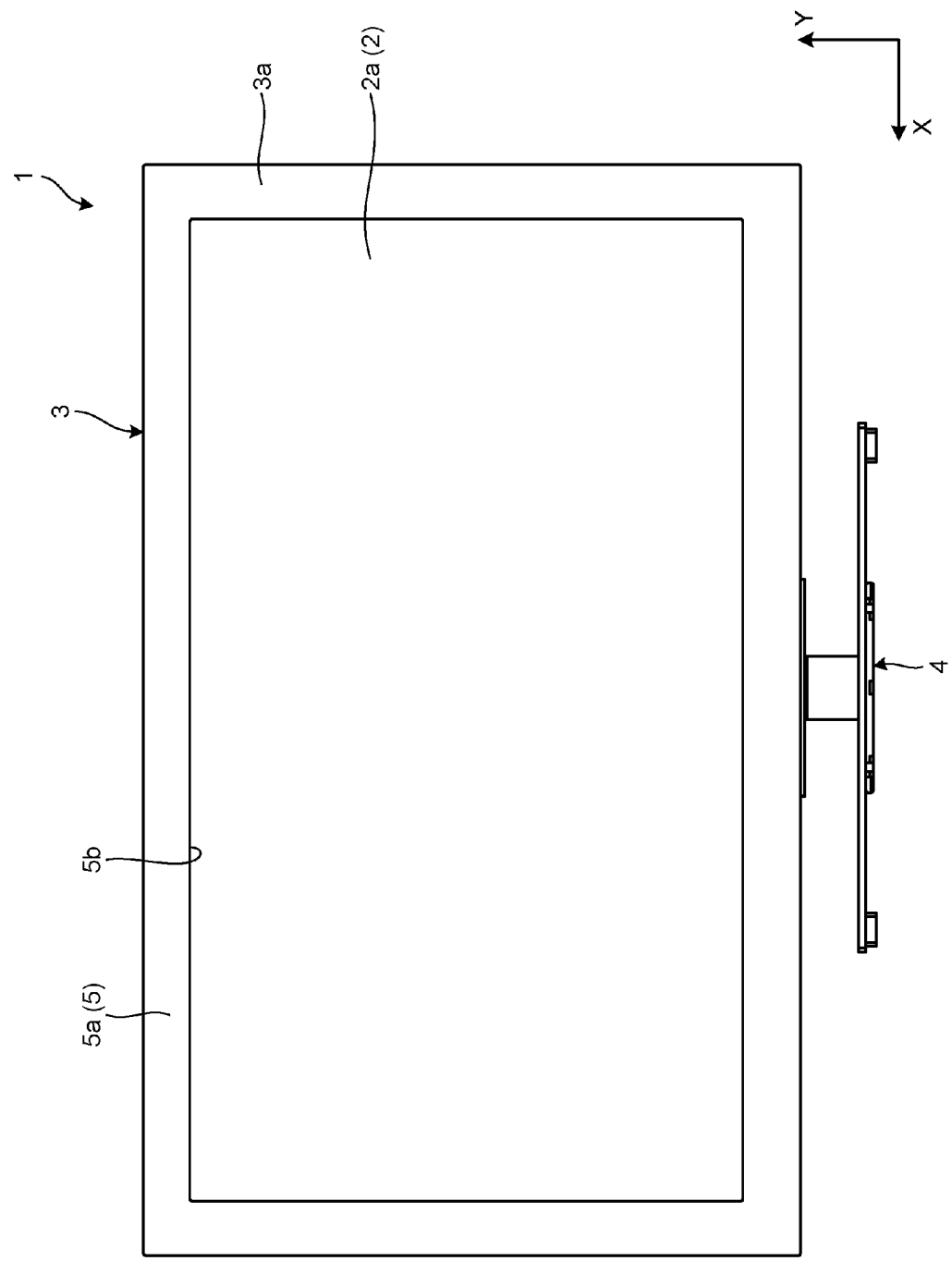
FIG. 1 is an exemplary front view of a display device according to an embodiment.
Figure 2:
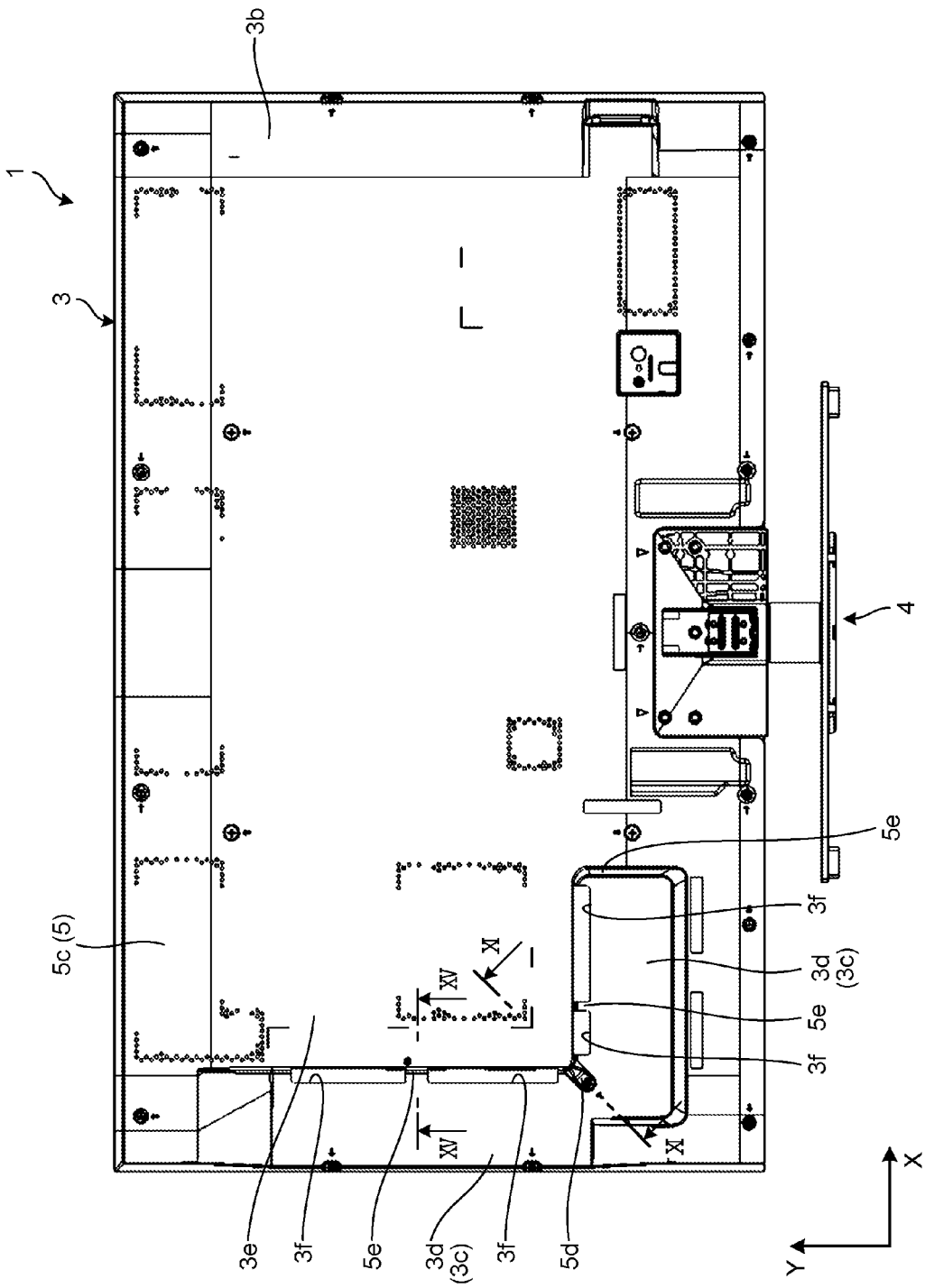
FIG. 2 is an exemplary rear view of the display device in the embodiment.

As illustrated in FIGS. 1 and 2, the display device 1 according to the present embodiment comprises a main body 3 and a leg 4 that supports the main body 3. The main body 3 comprises a built-in display 2 such as a liquid crystal display (LCD).

The main body 3 comprises a front face 3a and a rear face 3b on an opposite side of the front face 3a. The main body 3 is configured to be thin in the front-back direction, is horizontally oblong in appearance when viewed from the front, and is formed in the shape of a flat rectangular parallelepiped. A front mask 5a that covers a front face 2a of the display 2 and that constitutes a housing 5 also comprises a rectangular opening 5b formed thereon. Through the opening 5b, the front face 2a comprising the display screen of the display 2 is exposed. In the present embodiment, the front face 2a comprising the display screen corresponds to a first face. A portion on the front face 2a exposed via the opening 5b is the display screen.

Figure 3:
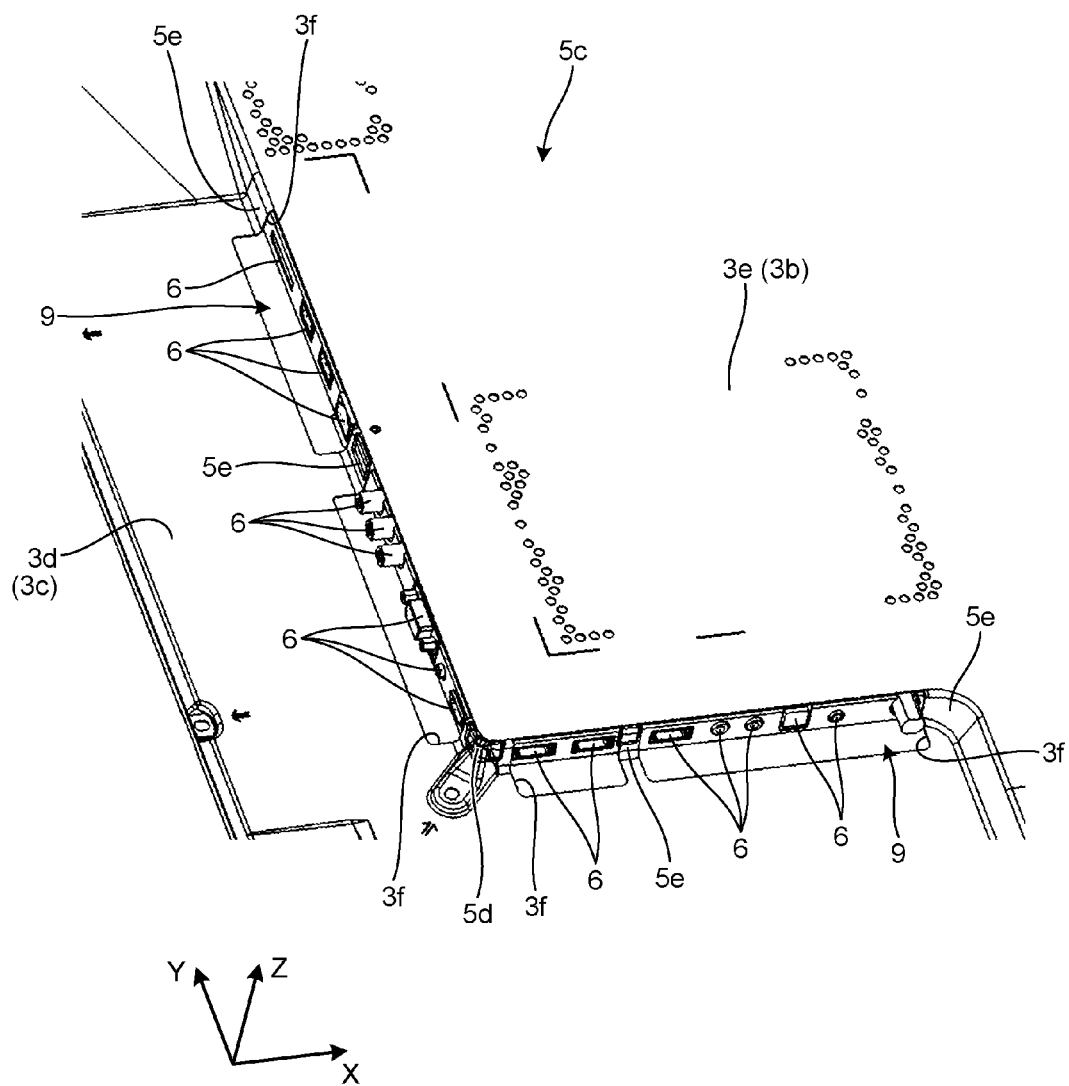
FIG. 3 is an exemplary perspective view of a portion on a rear side of the display device in the embodiment.

A rear cover 5c that covers a rear face 3b of the main body 3 and that constitutes the housing 5 also has an L-shaped depression 3c formed thereon from the left-side area in FIG. 2 to the lower-side area in FIG. 2. Moreover, as illustrated in FIG. 3, a bottom face 3d of the depression 3c and a top face 3e, which serves as a general surface of the rear face 3b, have a difference in their respective levels, and a plurality of slit-like openings 3f are formed therebetween. The openings 3f are formed to open in a direction along the bottom face 3d (rear face 3b) (in the present embodiment, formed to open either laterally or downwardly). Through the openings 3f are exposed a plurality of connector terminals 6. As is clear from FIGS. 2 and 4, the rear cover 5c covers a rear face 2b of the display 2. In the present embodiment, the rear face 2b of the display 2 corresponds to a second face and the rear cover 5c corresponds to a first cover. The openings 3f extend up to the bottom face 3d. Thus, interference between the rear cover 5c and the connector terminals 6 can be prevented when the rear cover 5c is mounted over the rear face 2b of the display 2.

Figure 4:
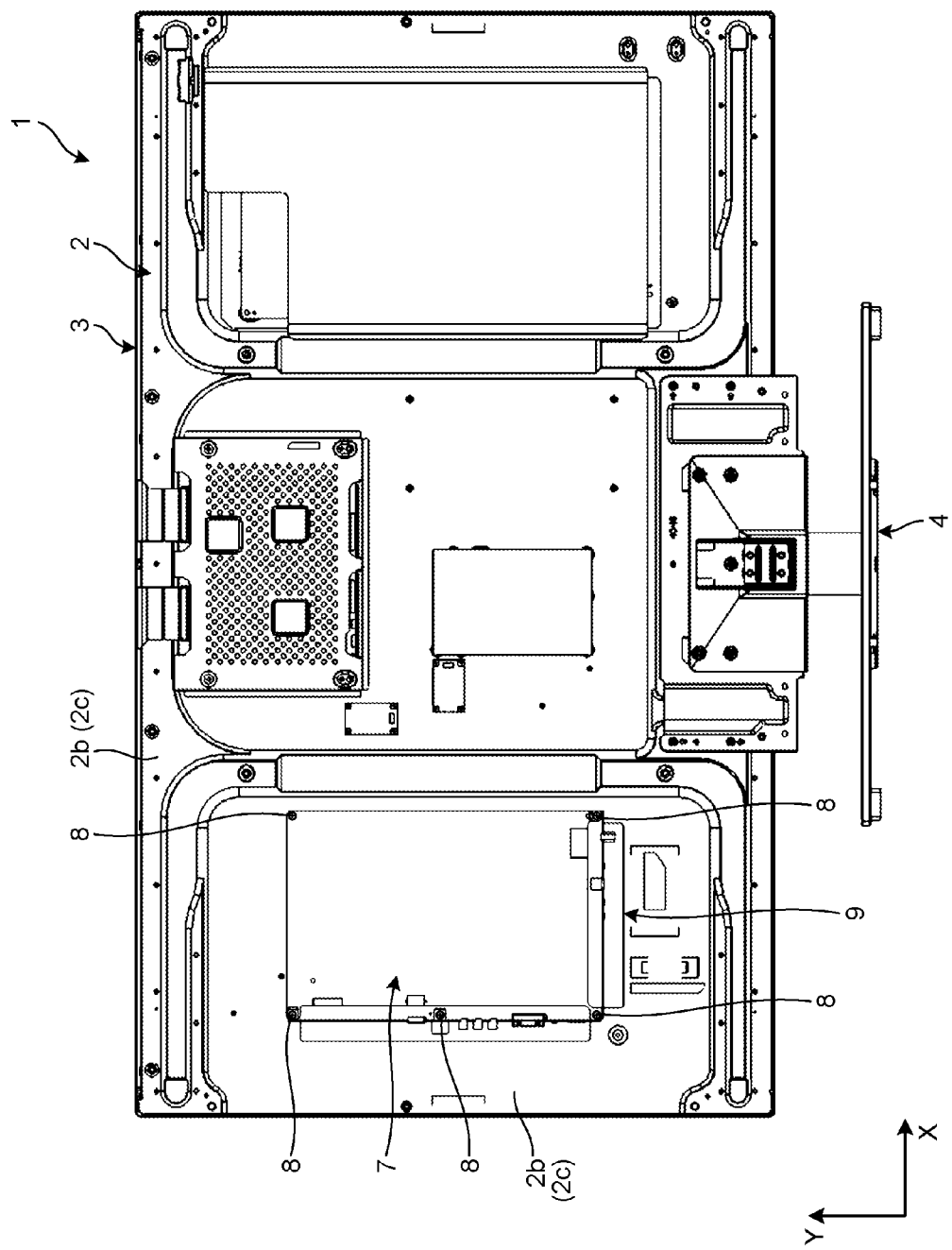
FIG. 4 is an exemplary rear view of the display device with a rear cover removed therefrom, in the embodiment.
Figure 6:
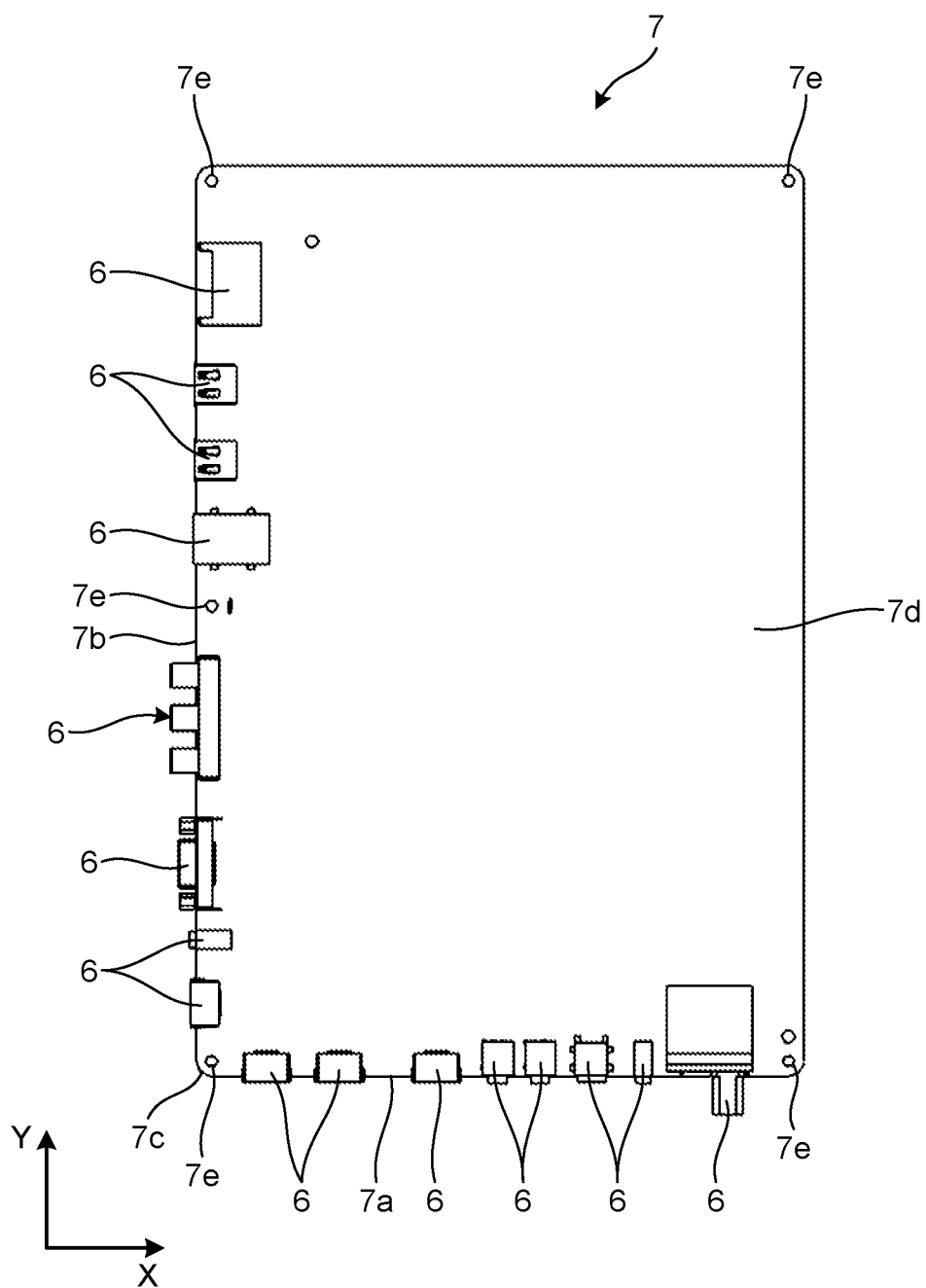
FIG. 6 is an exemplary plan view of the substrate of the display device in the embodiment.

As illustrated in FIG. 4, a circuit substrate 7 is fixed to a rear wall 2c, which constitutes the rear face 2b of the display 2, with screws 8 serving as fastening members. In the present embodiment, as illustrated in FIG. 6, the connector terminals 6 are disposed at a vicinity of and along a lower side 7a and a left-hand side 7b adjacent to the lower side 7a of the circuit substrate 7 positioned in the leftmost portion in FIG. 4. The examples of the connector terminals 6 include card sockets, universal serial buses (USBs), local area network (LAN) cable sockets, RCA terminals, D-terminals, S-terminals, DV terminals, radio frequency (RF) terminals, SCART terminals, serial digital interface (SDI) terminals, and audio pin terminals. The connector terminals 6 are exposed to the outside of the housing 5 through the openings 3f formed on the rear cover 5c. Meanwhile, the circuit substrate 7 comprises wiring patterns (not illustrated) designed using conductors and electronic components (not illustrated) other than the connector terminals 6 mounted thereon.

Figure 5:
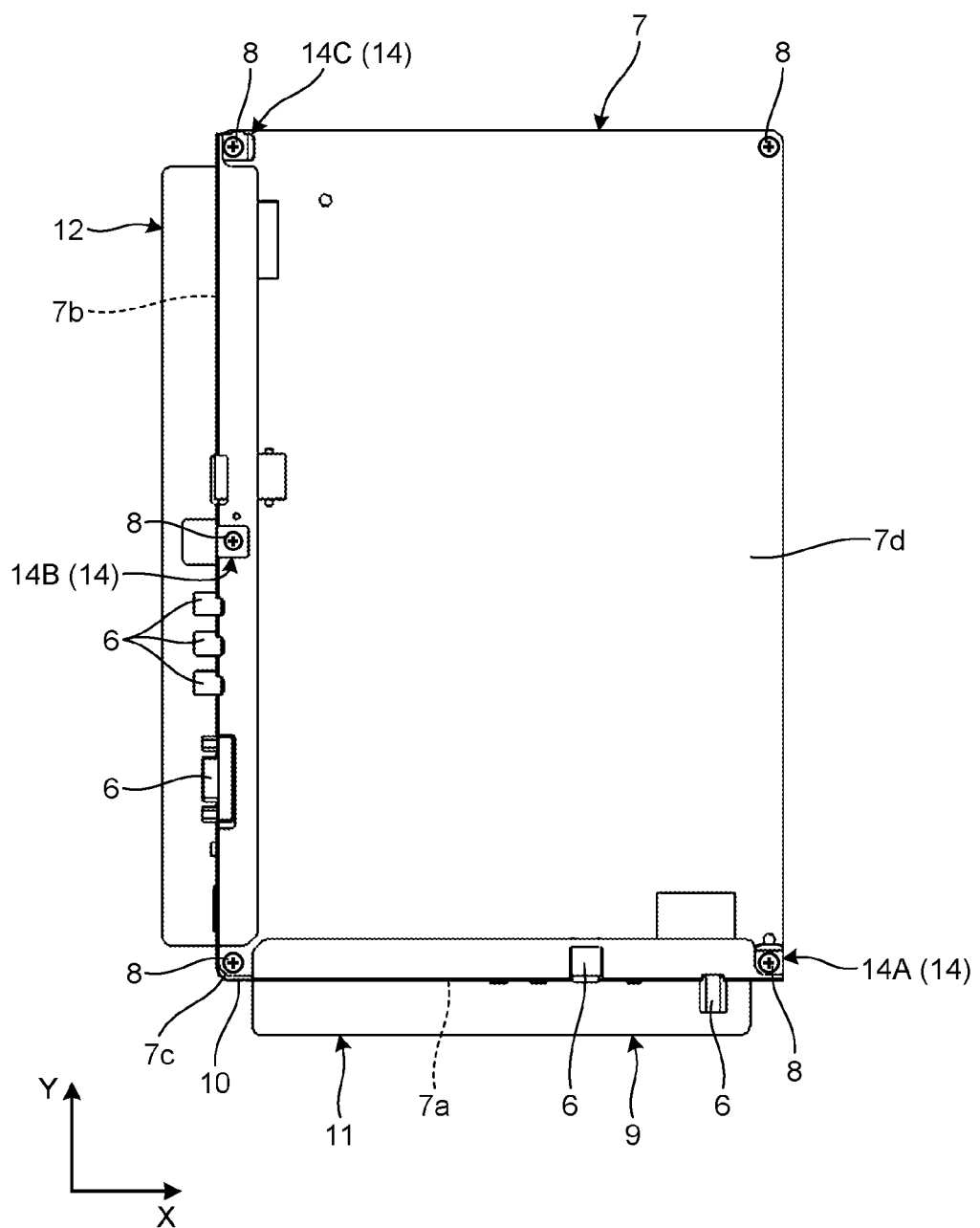
FIG. 5 is an exemplary plan view of a substrate and aside cover of the display device in the embodiment.

Herein, the connector terminals 6 are disposed at the vicinity of the lower side 7a and the left-hand side 7b of the circuit substrate 7, as illustrated in FIG. 6. Hence, in a configuration in which the connector terminals 6 are merely exposed through the slit-like openings 3f, the periphery of the circuit substrate 7 (in the present embodiment, the lower side 7a and the left-hand side 7b) is also exposed through the openings 3f together with the connector terminals 6. That mars the aesthetic appearance of the display device 1. Thus, in the present embodiment, a side cover 9 is disposed along the lower side 7a and the left-hand side 7b of the circuit substrate 7 as illustrated in FIG. 5. Thus, as illustrated in FIG. 3, the lower side 7a and the left-hand side 7b of the circuit substrate 7 is covered by the side cover 9. Therefore, the lower side 7a and the left-hand side 7b are prevented from being exposed to the outside through the openings 3f. Herein, the side cover 9 partially covers the openings 3f, and partially covers the lower side 7a and the left-hand side 7b of the circuit substrate 7 in a lateral fashion. In the present embodiment, the side cover 9 corresponds to a second cover and corresponds to a cover member. Moreover, in the present embodiment, the lower side 7a of the circuit substrate 7 corresponds to a first side and the left-hand side 7b of the circuit substrate 7 corresponds to a second side.

Figure 7:
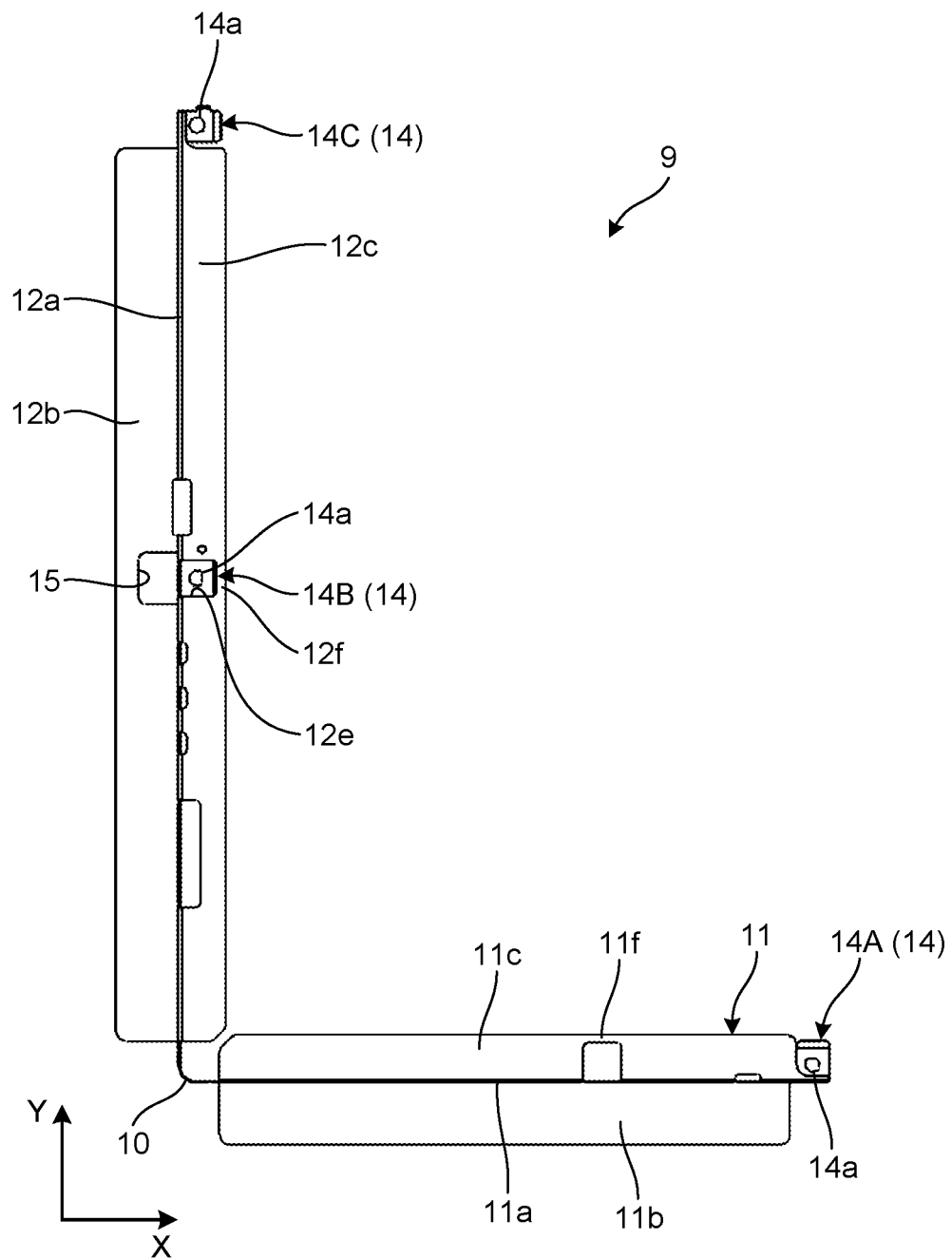
FIG. 7 is an exemplary plan view of the side cover of the display device in the embodiment.
Figure 8:
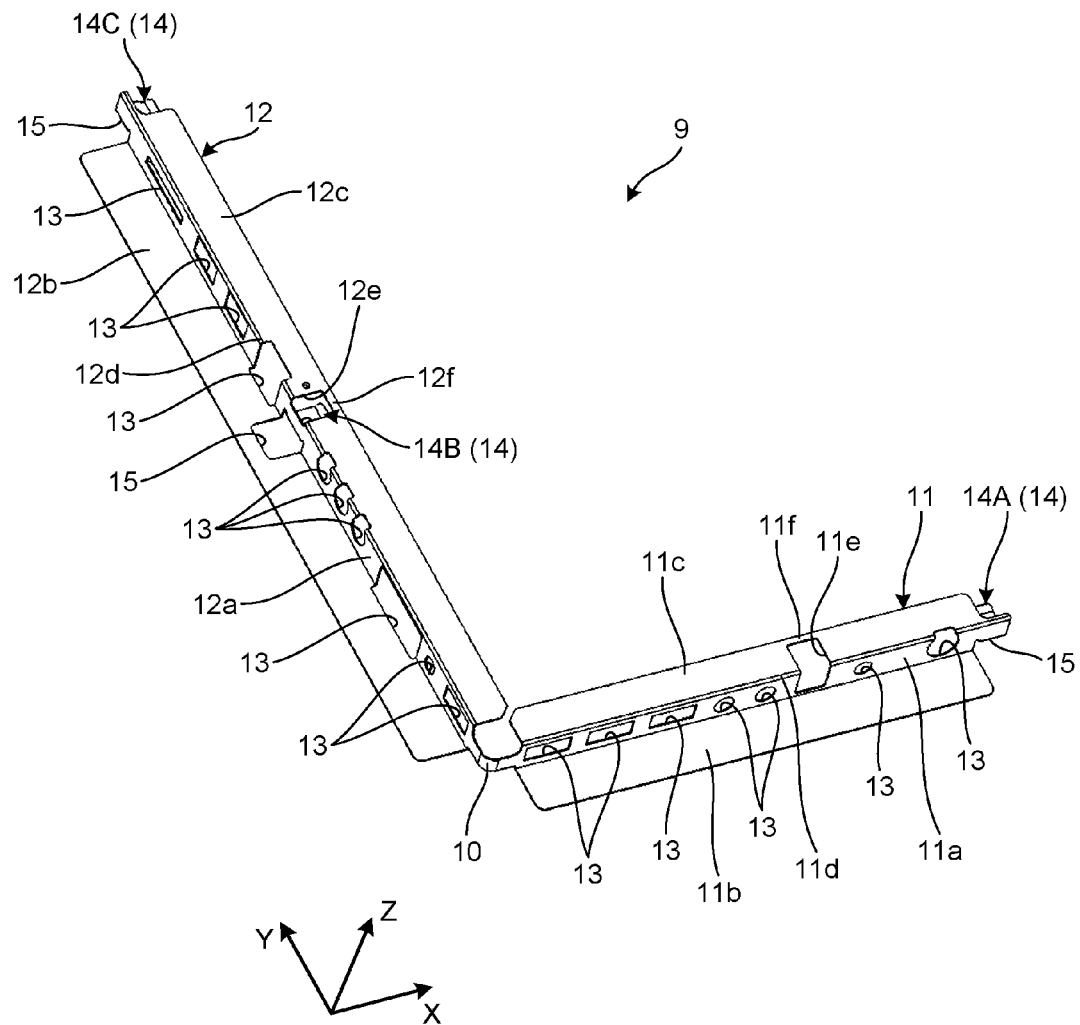
FIG. 8 is an exemplary perspective view of the side cover of the display device in the embodiment.

As illustrated in FIGS. 5, 7, and 8, the side cover 9 comprises a first portion 11, a second portion 12, and a linking portion 10. The first portion 11 is arranged along the lower side 7a of the circuit substrate 7. The second portion 12 is arranged along the left-hand side of the circuit substrate 7. The linking portion 10 links the first portion 11 and the second portion 12 with each other. Regarding the side cover 9 according to the present embodiment, since the first portion 11 and the second portion 12 are linked by the linking portion 10, a smaller number of components are required as compared to the case when a separate cover is mounted for each of the plurality of sides. That enables achieving reduction in the time and efforts during manufacturing.

The first portion 11 comprises a first facing portion 11a, a first bottom wall 11b, and a first top wall 11c. The first facing portion 11a opposes the lower side 7a of the circuit substrate 7, extends along the lower side 7a in a belt-like manner, and rises from the rear face 2b of the display 2. The first bottom wall 11b is connected to the first facing portion 11a at a side of the rear face 2b, and extends in a belt-like manner along the rear face 2b. The first top wall 11c is connected to the first facing portion 11a at a side opposite to the side of the rear face 2b, and extends in a belt-like manner parallel to the rear face 2b. Thus, due to the first facing portion 11a, the first bottom wall 11b, and the first top wall 11c that are mutually connected; the first portion 11 is formed to have an S-shaped cross-section.

The second portion 12 comprises a second facing portion 12a, a second bottom wall 12b, and a second top wall 12c. The second facing portion 12a opposes the left-hand side 7b of the circuit substrate 7, extends along the left-hand side 7b in a belt-like manner, and rises from the rear face 2b of the display 2. The second bottom wall 12b is connected to the second facing portion 12a at a side of the rear face 2b, and extends in a belt-like manner along the rear face 2b. The second top wall 12c is connected to the second facing portion 12a at a side opposite to the rear face 2b, and extends in a belt-like manner parallel to the rear face 2b. Thus, due to the second facing portion 12a, the second bottom wall 12b, and the second top wall 12c that are mutually connected, the second portion 12 is formed to have an S-shaped cross-section.

On the first facing portion 11a and on the second facing portion 12a that are formed as vertical walls, openings 13 are formed in such a way that the connector terminals 6 are exposed therethrough. Each of the openings 13 is provided to each of the connector terminals. Accordingly, the lower side 7a and the left-hand side 7b of the circuit substrate 7 are prevented from being exposed through the openings 13. In the present embodiment, the openings 13 correspond to second openings.

Figure 10:
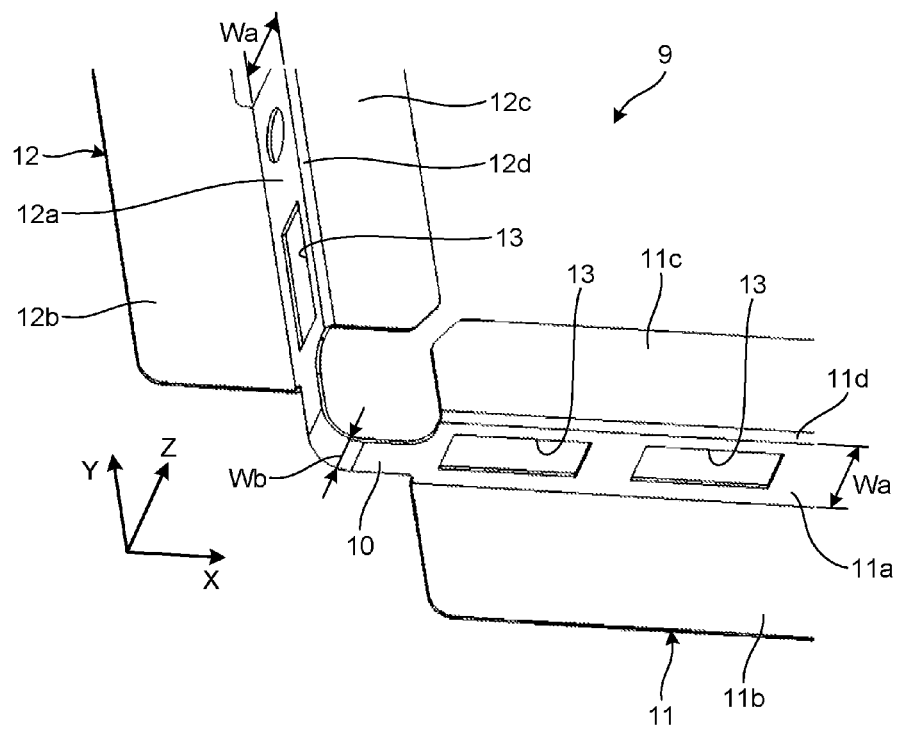
FIG. 10 is an exemplary perspective view of a portion at which a linking portion of the side cover of the display device is provided in the embodiment.

As illustrated in FIGS. 5, 8, and 10, the linking portion 10 links together the first portion 11 and the second portion 12 arranged along a direction so as to intersect each other (in the present embodiment, arranged along mutually perpendicular directions). As illustrated in FIG. 5, when fixed in accordance with the shape of the circuit substrate 7, the linking portion 10 is bent in an arc-like manner around the outside of a corner 7c formed between the lower side 7a and the left-hand side 7b of the circuit substrate 7.

Figure 9:
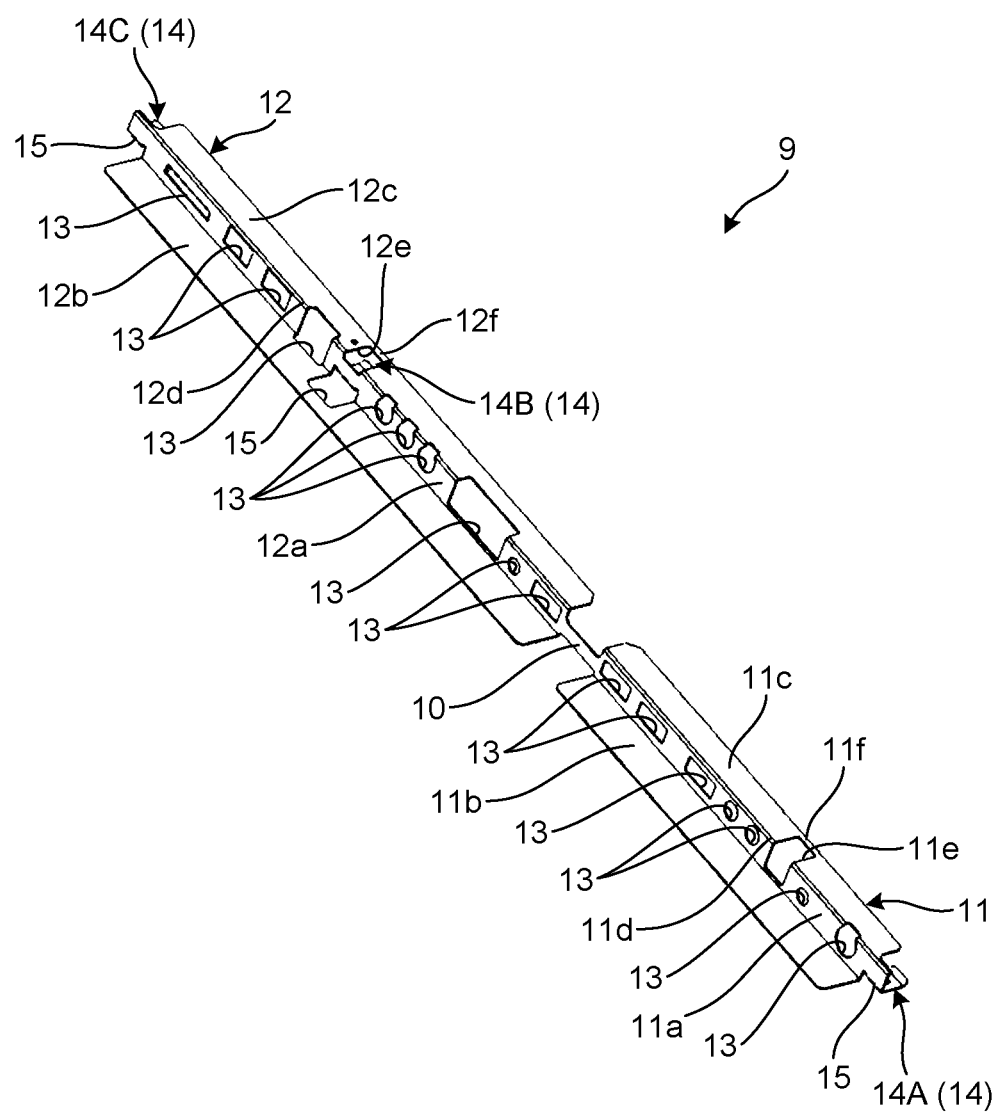
FIG. 9 is an exemplary perspective view of the side cover of the display device before being bent in the embodiment.

As illustrated in FIG. 9, in the present embodiment, the linking portion 10 is not bent before installed in the display device 1. Accordingly, the first portion 11, the linking portion 10, and the second portion 12 are arranged in a linearly extended manner (in a rod-like manner). Thus, when the side cover 9 is transported from the manufacturing site thereof to the assembling site of the display device 1, the side cover 9 can be in the linear form (elongated form), as illustrated in FIG. 9. As compared to the bent form illustrated in FIG. 8, the elongated form makes it easier to stack a plurality of the side covers 9 in a more compact manner. This, according to the present embodiment, by keeping the side covers 9 in the elongated form upon manufacturing, transportation thereof becomes more efficient.

The linking portion 10 is bent before assembling the side cover 9 in the display device 1. In the present embodiment, the linking portion 10 is thinner than the first portion 11 and the second portion 12. More particularly, a width Wb (in the S direction) of the linking portion 10 is smaller than a width Wa (in the Z direction) of the first portion 11 and of the second portion 12. Besides, in contrast to the S-shaped cross-section of the first portion 11 and of the second portion 12, the linking portion 10 has a plate-like shape. Hence, the linking portion 10 has a lower resistance to bending than the first portion 11 and the second portion 12. Thus, by applying force to the first portion 11 and the second portion 12, the worker can bend the side cover 9 at the linking portion 10 and thus achieve the bent form of the side cover 9 in a relatively easy manner. For that reason, the linking portion 10 can be called a bending portion or an easily-deformable portion. Herein, in order to bend the linking portion 10 in a predetermined shape, the worker can press the linking portion 10 against a curved surface for pressing of a predetermined jig. Meanwhile, on the linking portion 10, at least a single folding line can be provided as a groove along the Z direction.

Figure 11:
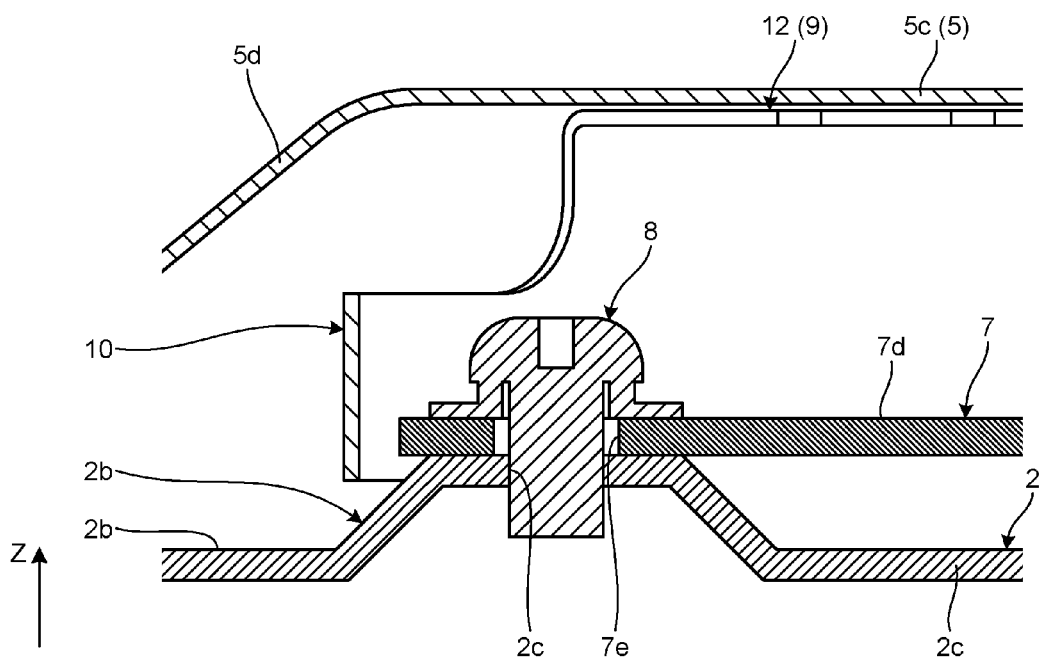
FIG. 11 is an exemplary cross-sectional view taken along the line XI-XI illustrated in FIG. 2, in the embodiment.

As illustrated in FIGS. 10 and 11, as compared to a top side 11d of the first facing portion 11a and a top side 12d of the second facing portion 12a positioned away from the rear face 2b of the display 2, the linking portion 10 is positioned closer to the rear face 2b. That makes it easier to prevent interference between a tilted portion 5d of the rear cover 5c and the linking portion 10. Thus, by avoiding interference with the linking portion 10, the tilted portion 5d (see FIG. 3) formed on the rear cover 5c enables achieving enhancement in the aesthetic appearance of the display device 1.

Figure 12:
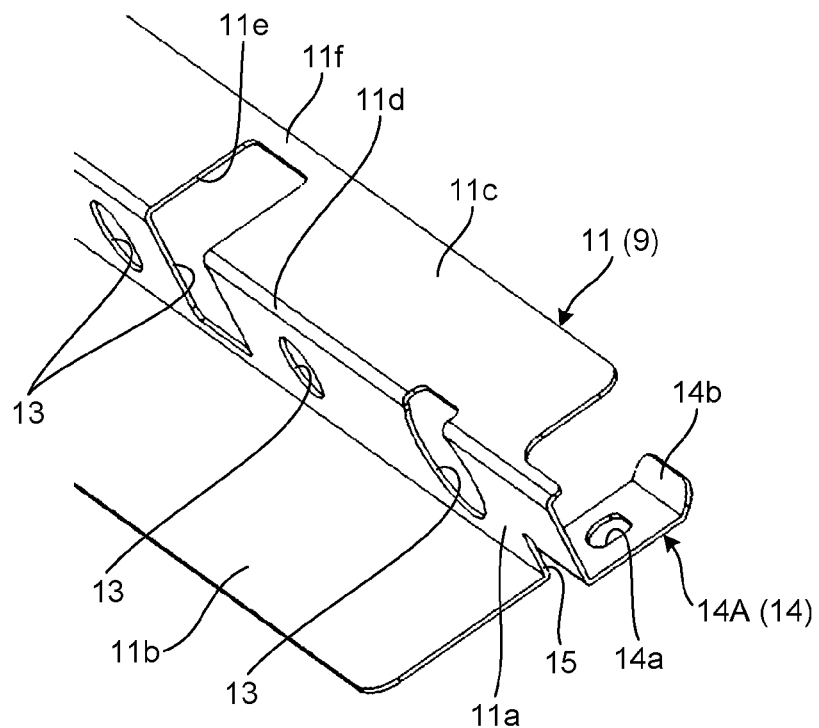
FIG. 12 is an exemplary perspective view of a portion at which a first fixing piece of the side cover of the display device is provided in the embodiment.
Figure 13:
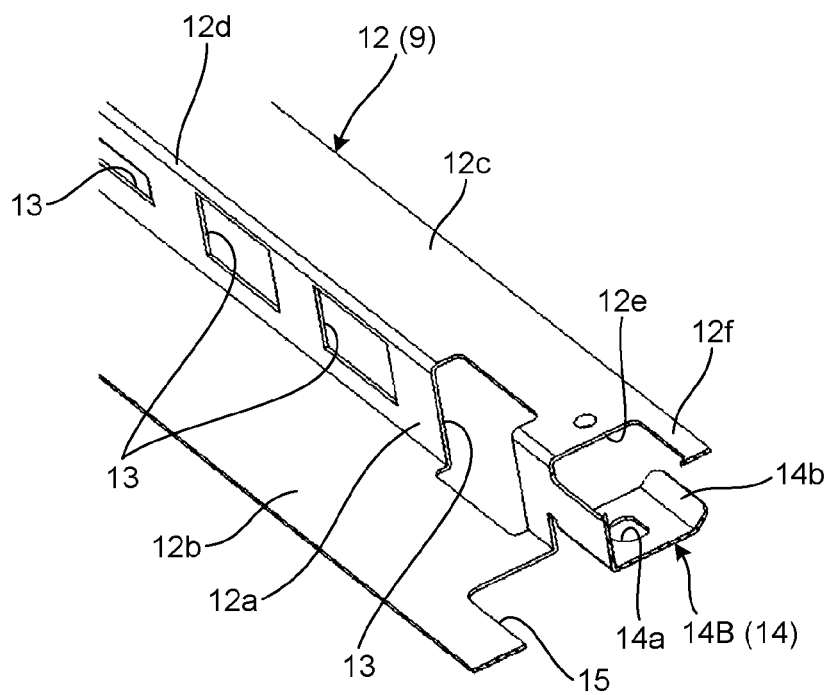
FIG. 13 is an exemplary perspective view of a portion at which a second fixing piece of the side cover of the display device is provided in the embodiment.
Figure 14:
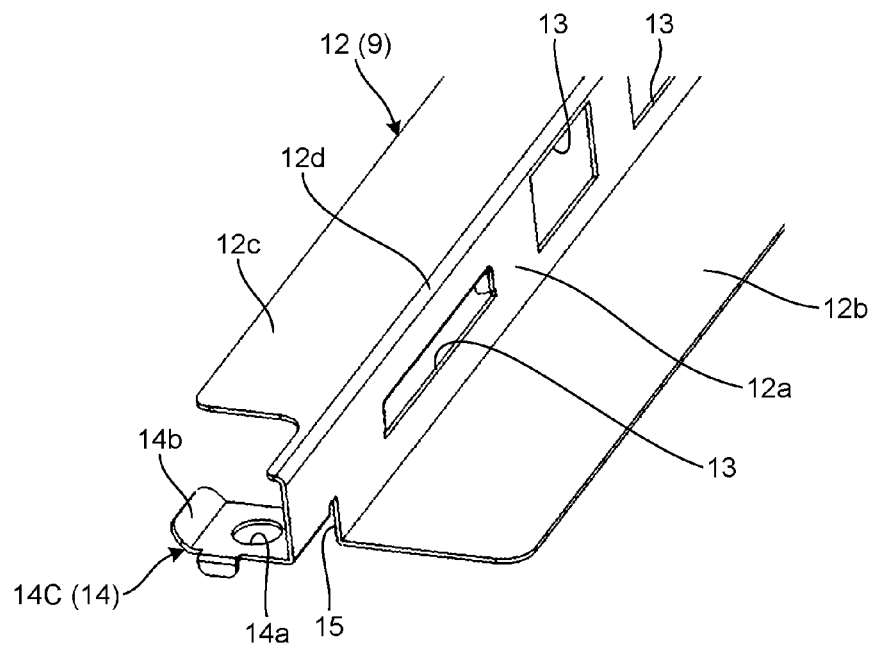
FIG. 14 is an exemplary perspective view of a portion at which a third fixing piece of the side cover of the display device is provided in the embodiment.
Figure 15:
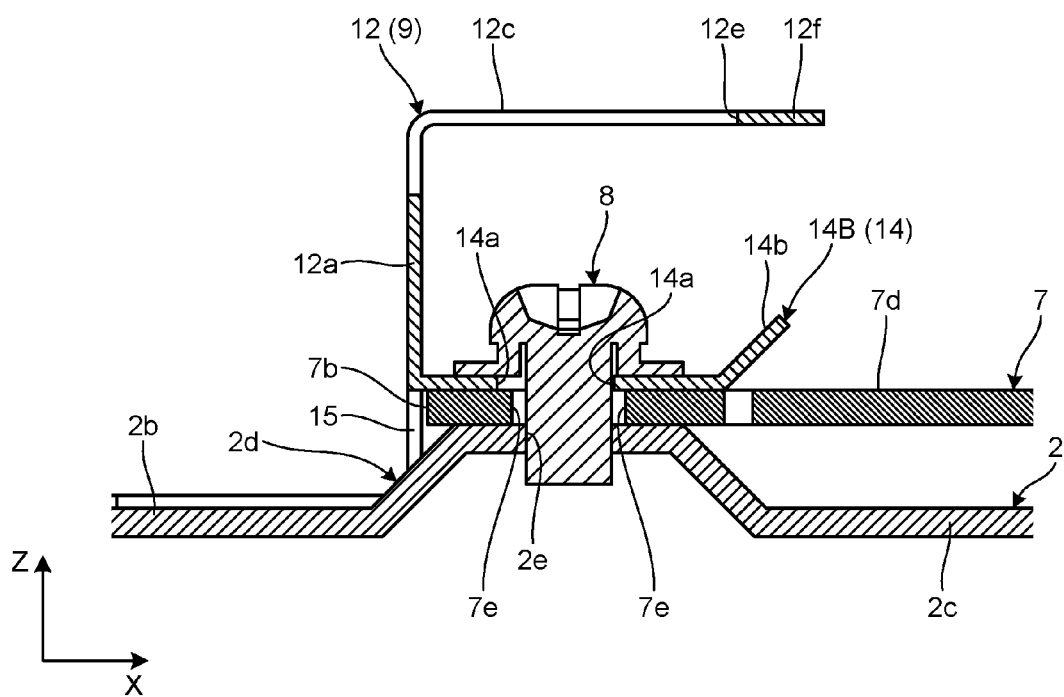
FIG. 15 is an exemplary cross-sectional view taken along the line XV-XV illustrated in FIG. 2, in the embodiment.

As illustrated in FIG. 8 and in FIGS. 12 to 14, the side cover 9 comprises a plurality of fixing pieces 14 each having a through hole 14a formed thereon. In the present embodiment, the fixing pieces 14 are disposed at three locations in all, namely, a location at an end of the first portion 11 away from the linking portion 10 (first fixing piece 14A), a location at a middle part of the second portion 12 (second fixing piece 14B), and a location at an end of the second portion 12 away from the linking portion 10 (third fixing piece 14C). In the present embodiment, as illustrated in FIG. 15, each screw 8 inserted into the through hole 14a of one of the fixing pieces 14 and into a through hole 7e formed on the circuit substrate 7, and is screwed into a screw hole 2e formed on a boss portion 2d disposed on the rear wall 2c of the display 2. As a result, the side cover 9 and the circuit substrate 7 is fixed to the display 2. Thus, in order to fix the side cover 9, the fixing configuration for the circuit substrate 7 (i.e., the fixing configuration comprising the screws 8 and the boss portions 2d) is used.

As illustrated in FIG. 15, each fixing piece 14 protrudes toward the circuit substrate 7 from the first facing portion 11a or the second facing portion 12a opposing an edge of the circuit substrate 7 (in the present embodiment, the lower side 7a or the left-hand side 7b), and is mounted on a top face 7d of the circuit substrate 7. Herein, although FIG. 15 illustrates the configuration of the second fixing piece 14B, the first fixing piece 14A and the third fixing piece 14C also have the same configuration.

Each fixing piece 14 is configured by cutting and raising the first facing portion 11a or the second facing portion 12a toward the circuit substrate 7. As a result, in an area on the first facing portion 11a or the second facing portion 12a which is closer to the rear face 2b than the fixing piece 14, a void portion 15 is formed adjacent to the boss portion 2d comprising the through hole 14a through which the screw 8 is inserted. Because of the void portion 15, the boss portion 2d is prevented from interfering with the first facing portion 11a or the second facing portion 12a. Moreover in such a configuration, since each fixing piece 14 is cut and raised from below to upward with respect to the top face 7d of the circuit substrate 7, the suppress strength due to the springback phenomenon acts on that fixing piece 14 in the direction in which the fixing piece 14 is pressed toward the top face 7d of the circuit substrate 7. Hence, such a configuration also makes it easier to maintain the relative positional relation between the circuit substrate 7 and the side cover 9. Meanwhile, each void portion 15 is covered by a side wall 5e of the rear cover 5c and is therefore not exposed.

At the leading end of each fixing piece 14, a warp portion 14b is formed with the tip thereof bent in a direction away from the top face 7d of the circuit substrate 7. When the side cover 2 is disposed along a periphery of the circuit substrate 7 (along the lower side 7a or the left-hand side 7b), the side cover 9 is brought close to the circuit substrate 7 in a lateral direction. Thus, because the warp portion 14b is formed at the leading end of each fixing piece 14, the fixing piece 14 can be prevented from being interfered by the circuit substrate 7. Therefore, it becomes possible to reduce difficulty in arranging the fixing piece 14 at the predetermined position.

Figure 16:
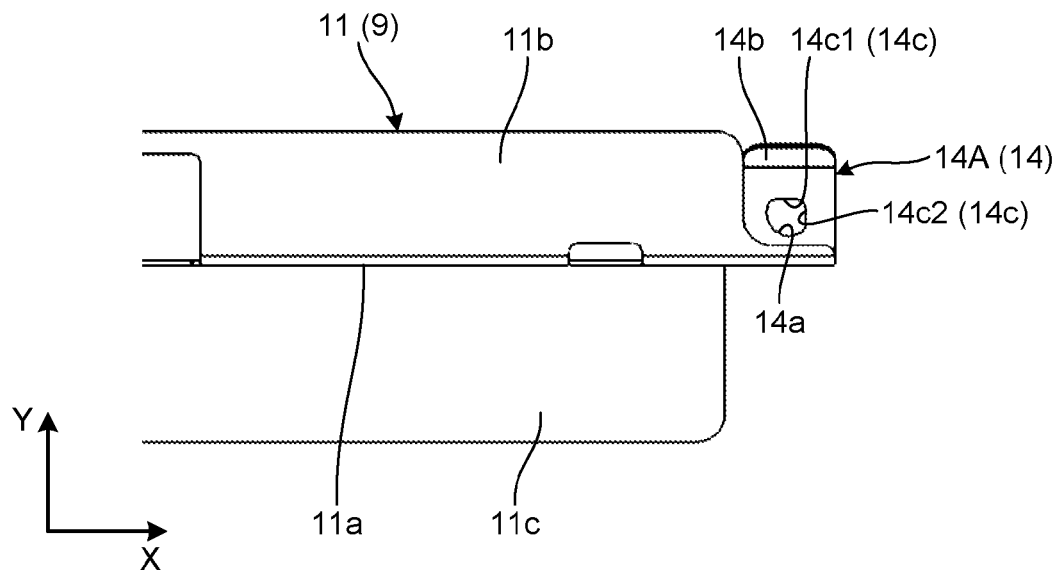
FIG. 16 is an exemplary plan view of the portion at which the first fixing piece of the side cover of the display device is provided in the embodiment.
Figure 17:
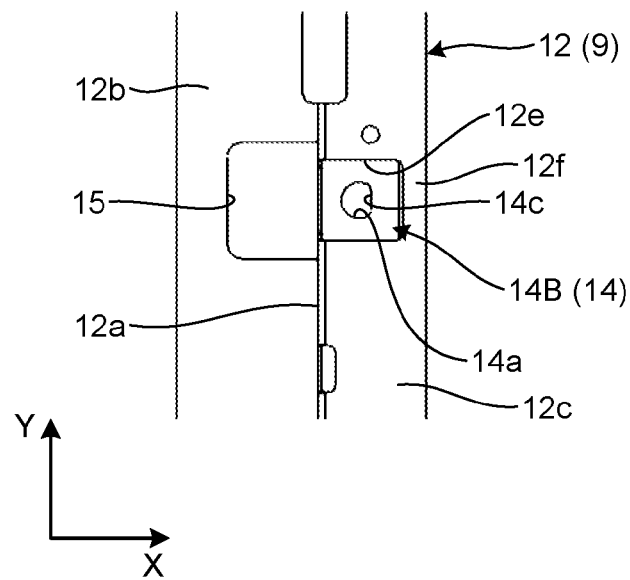
FIG. 17 is an exemplary plan view of the portion at which the second fixing piece of the side cover of the display device is provided in the embodiment.

The through hole 14a formed on each fixing piece 14 is larger in size than the outside diameter of the screws 8. Besides, in the present embodiment, as illustrated in FIGS. 16 and 17, some of the through holes 14a comprise one or more locking side portions 14c formed therein to restrict the side cover 9 from being out of position. The locking side portions 14c are formed as rectilinear edges so as to restrict the movement of the side cover 9 in the direction perpendicular to the locking side portions 14c. Thus, in the present embodiment, the through holes 14a are formed in noncircular by the locking side portions 14c, which increases accuracy in the positioning the side cover 9. As illustrated in FIG. 16, the through hole 14a formed on the first fixing piece 14A has a locking side portion 14c1 that restricts the downward movement of the side cover 9 when viewed from behind and has a locking side portion 14c2 that restricts the leftward movement of the side cover 9 when viewed from behind. Moreover, as illustrated in FIG. 17, the through hole 14a formed on the second fixing piece 14B has the locking side portion 14c2 that restricts the leftward movement of the side cover 9. Meanwhile, in the second fixing piece 14B, the side cover 9 is allowed to have positional degree of freedom in the direction along the left-hand side 7b of the circuit substrate 7. That eliminates the difficulty that may otherwise arise while fixing the corresponding screw 8.

Each of the locking side portions 14c restricts the lateral movement (in the present embodiment, downward movement or leftward movement when viewed from behind) of the side cover 9. For that reason, it becomes possible to prevent the side cover 9 from interfering with the tilted portion 5d or the side wall 5e (see FIG. 3) of the rear cover 5c.

As illustrated in FIG. 8, on the first top wall 11c and the second top wall 12c are respectively formed through holes 11e and 12e with the aim of avoiding interference with the screws 8, or tools, or the connector terminals 6. However, at the leading end side with respect to the portions having the through holes 11e and 12e formed thereon (i.e., on the distant side from the first facing portion 11a and the second facing portion 12a), no notches are formed but bridge members 11f and 12f are disposed that extend in the longitudinal direction. That enables preventing a decline in the tolerance at the portions having the through holes 11e and 12e formed thereon. Besides, when external force is applied to the side cover 9 for the purpose of bending it at the linking portion 10, it becomes possible to bend the linking portion 10 in a more reliable manner.

Figure 18:
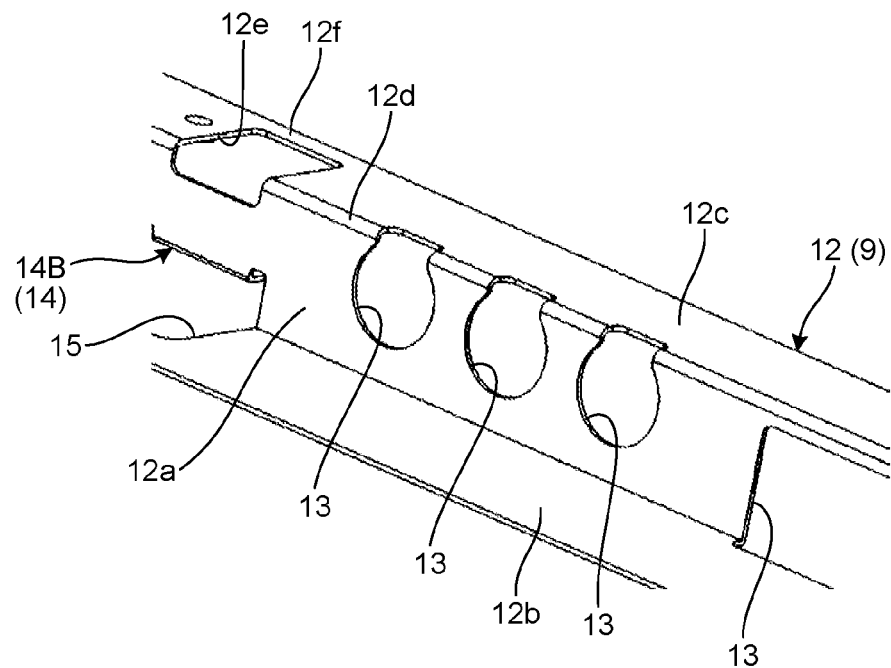
FIG. 18 is an exemplary perspective view of a portion of the side cover of the display device in the embodiment.

Meanwhile, as illustrated in FIG. 18, regarding the relatively larger openings 13 reaching the top side 11d of the first facing portion 11a or the top side 12d of the second facing portion 12a (i.e., the openings 13 reaching boundary region of the first top wall 11c or the second top wall 12c), the openings 13 are notched up to the first top wall 11c or the second top wall 12c so as to prevent deformation such as warping from occurring at the borders of the openings 13.

Figure 19:
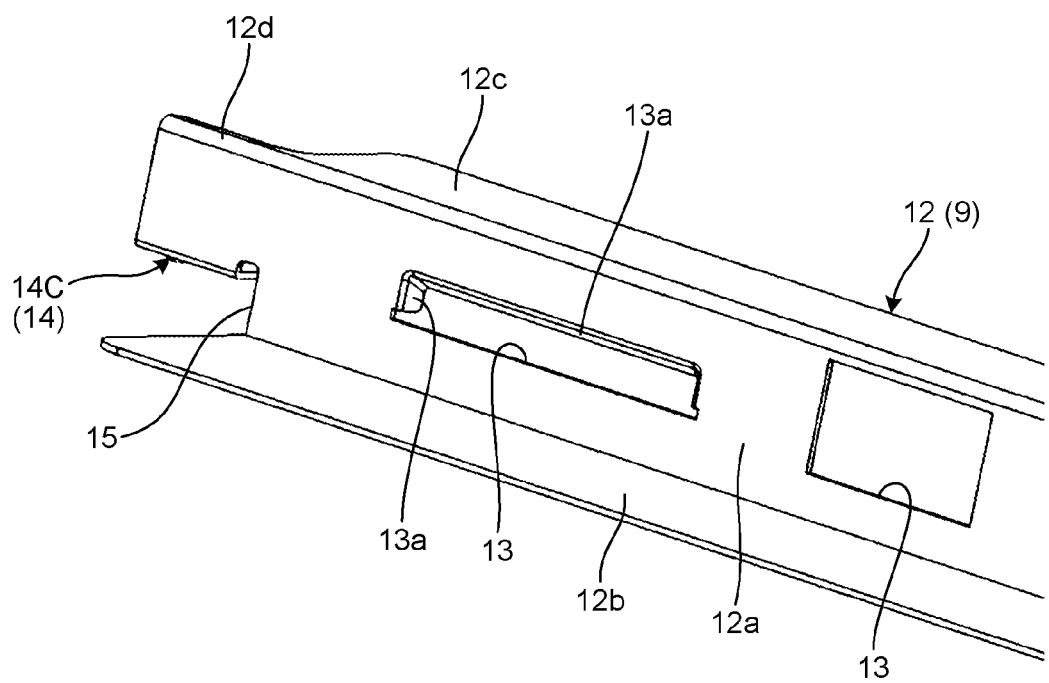
FIG. 19 is an exemplary perspective view of another portion of the side cover of the display device in the embodiment.

Moreover, as illustrated in FIG. 19, regarding the openings 13 formed opposite to those connector terminals 6 in which inserts such as cards or the like are inserted, a bending portion 13a is formed in an inwardly-bending manner at the border of each opening 13. Because of that, when inserts are inserted in the openings 13, it becomes possible to prevent interference between the inserts and the borders of the respective openings 13 and thus prevent the inserts from getting damaged.

In the abovementioned configuration, the circuit substrate 7 and the side cover 9 are fixed to the rear wall 2c of the display 2 in the sequence illustrated in FIGS. 20A to 20C. Firstly, as illustrated in FIG. 20A, the worker places the circuit substrate 7 at a predetermined position on the rear wall 2c (S1). At S1, without fixing the side cover 9, the worker can only fix the circuit substrate 7 to the display 2 by tightening in advance only those screws 8 which are used to fix the circuit substrate 7.

Subsequently, as illustrated in FIG. 20B, the worker brings the first portion 11 of the side cover 9 closer to the lower side 7a of the circuit substrate 7 from below, and places the first portion 11 at a predetermined position by abutting it against the lower side 7a (S2). At S2, the linking portion 10 of the side cover 9, which is placed at the predetermined position, is already bent. That is, before performing S2, the side cover 9 is bent at a bending angle shallower than the bending angle in the assembled state thereof (S1a). Here, the predetermined position is a position that allows the through holes 7e of the circuit substrate 7 to overlap the respective through holes 14a of the fixing pieces 14.

Then, as illustrated in FIG. 20C, the worker bends the side cover 9 to a greater extent so as to bring the second portion 12 closer to the left-hand side 7b of the circuit substrate 7 from the left side, and places the second portion 12 at a predetermined position by abutting it against the left-hand side 7b (S3). Here, the predetermined position is a position that allows the through holes 7e of the circuit substrate 7 to overlap the respective through holes 14a of the fixing pieces 14. Since the side cover 9 is already bent by a smaller extent at S1a described above, it becomes possible for the worker to further bend the side cover 9 without much difficulty at S3. Besides, it also becomes possible to achieve a highly accurate bent form of the side cover 9 (i.e., to ensure less variability in the bent form of the side covers 9).

Subsequently, the worker inserts the screws 8 into the respective pairs of the through holes 14a and 7e, and tightens the screws 8 in the screw holes 2e of the respective boss portions 2d disposed on the rear wall 2c of the display 2 (S4). Here, the tightening of the screws 8 is performed in an order of the first fixing piece 14A, the second fixing piece 14B, and the third fixing piece 14C. The through hole 14a formed on the first fixing piece 14A has two locking side portions 14c, the through hole 14a formed on the second fixing piece 14B has a single locking side portion 14c, and the through hole 14a formed on the third fixing piece 14C has no locking side portion 14c. Such a configuration makes it possible to enhance the accuracy of positioning the side cover 9 as well as to eliminate the difficulty that may otherwise arise while fixing the screws 8. Subsequently, the rear cover 5c is disposed to achieve the configuration illustrated in FIG. 2.

Embodiments are not limited to the aforementioned embodiment, and the embodiment described above can be modified in various ways. For example, although the abovementioned embodiment is explained with reference to a display device comprising connector terminals, the embodiment is also applicable to other electronic devices such as a personal computer comprising connector terminals. Moreover, although the abovementioned embodiment is explained with reference to the case of disposing connector terminals at the lower side and the left-hand side of the circuit substrate, the embodiment is also applicable for the case when connector terminals are disposed at other sides of the circuit substrate. Furthermore, the first facing portion and the second facing portion can be suitably interchanged. Moreover, for the purpose of fixing the components, fastening members other than screws, such as clips, can also be used. Moreover, the fastening members can be used to fix the second cover (cover member) not to the rear wall of the display but to another component such as the housing.

Besides, regarding the display, the circuit substrate, the connector terminal, the opening, the first cover, the rear cover, the linking portion, the through hole, the second cover, the cover member, the side cover, the fastening member, the second opening, the bending portion, the first facing portion, the second facing portion, the top side, the fixing piece, the warp portion, the locking side portion, the first side, and the second side, the specifications (method of operation, structure, shape, material, size, length, width, thickness, angle, number, arrangement, position, etc.) can be suitably modified.

According to the embodiments, it is possible to provide a display device that can be manufactured with less time and efforts.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
a display unit including a first face and second face, the first face including a display screen, the second face opposing the first face;
a housing comprising a back cover and housing the display unit, the back cover covering the second face and including a first opening;
a circuit substrate housed in the housing and including a first side and a second side;
a plurality of connector terminals disposed at the first side and the second side, and exposed through the first opening; and
a cover member covering the first opening across the first side and the second side, wherein
the cover member includes a first portion, a second portion, a linking portion, and a fixing piece, the first portion being disposed along the first side, the second portion being disposed along the second side, the linking portion linking between the first portion and the second portion,
the first portion and the second portion each includes a facing portion and a top wall, the facing portion extending in a first direction crossing the second face, the top wall being substantially parallel to the second face, a fourth opening extending across a boundary portion between the facing portion and the top wall,
the fixing piece is disposed on the facing portion,
a second opening is provided on the fixing piece,
the second opening is exposed through the top wall when viewed toward the second face,
the back cover comprises a third face and a fourth face, the fourth face being farther from the second face than the third face,
the back cover has a difference in level between the third face and the fourth face, and
the connector terminals are arranged between the third face and the fourth face.

2. The display device according to claim 1, wherein
a third opening is provided on the top wall, and
the second opening and the third opening are aligned in the first direction.

3. The display device according to claim 2, wherein the third opening is a through hole.

4. The display device according to claim 2, wherein the third opening is a cutout.

5. The display device according to claim 1, wherein the second opening and the top wall are arranged alternately along the first side or the second side.

6. The display device according to claim 1, wherein the facing portion includes an end in the first direction, the end being nearer to the second face than the top wall, and
the fixing piece is positioned between the end and the top wall.

7. A display device comprising:
a display unit including a first face and a second face, the first face including a display screen, the second face opposing the first face;
a housing comprising a back cover and housing the display unit, the back cover covering the second face and including a first opening;
a circuit substrate housed in the housing and including a first side and a second side;
a plurality of connector terminals disposed at the first side and the second side, and exposed through the first opening; and
a cover member covering the first opening across the first side and the second side, wherein
the cover member includes a first portion, a second portion, a linking portion, and a fixing piece, the first portion being disposed along the first side, the second portion being disposed along the second side, the linking portion linking between the first portion and the second portion,
the first portion and the second portion each includes a facing portion and a top wall, the facing portion extending in a first direction crossing the second face, the top wall being substantially parallel to the second face, a fourth opening extending across a boundary portion between the facing portion and the top wall,
the fixing piece is disposed on the facing portion,
the facing portion includes an end in a second direction crossing the second face, the end being nearer to the second face than the top wall,
the fixing piece is positioned between the end and the top wall,
the back cover comprises a third face and a fourth face, the fourth face being farther from the second face than the third face,
the back cover has a difference in level between the third face and the fourth face, and
the connector terminals are arranged between the third face and the fourth face.

* * * * *